(12) United States Patent
Esmael (10) Patent No.: US 10,797,656 B2
(45) Date of Patent: Oct. 6, 2020

(54) BREAKDOWN PROTECTION CIRCUIT FOR POWER AMPLIFIER

(71) Applicant: Analog Devices Global Unlimited Company, Hamilton (BM)

(72) Inventor: Mohamed Moussa Ramadan Esmael, Cairo (EG)

(73) Assignee: ANALONG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

(21) Appl. No.: 16/055,437

(22) Filed: Aug. 6, 2018

(65) Prior Publication Data
US 2020/0044614 A1 Feb. 6, 2020

(51) Int. Cl.
*H03F 1/52* (2006.01)
*H03F 3/20* (2006.01)
*G01R 31/28* (2006.01)
*H03F 3/19* (2006.01)

(52) U.S. Cl.
CPC .............. *H03F 1/523* (2013.01); *H03F 3/20* (2013.01); *G01R 31/28* (2013.01); *H03F 3/19* (2013.01)

(58) Field of Classification Search
CPC . H03F 1/22; H03F 1/223; H03F 1/226; H03F 1/52; H03F 1/523
USPC ...................... 330/207 P, 298, 311
See application file for complete search history.

(56) References Cited

U.S. PATENT DOCUMENTS

| 4,382,195 | A | * | 5/1983 | Pohl | H03F 1/32 257/E27.057 |
| 6,720,831 | B2 | * | 4/2004 | Dening | H03F 1/52 330/207 P |
| 6,990,323 | B2 | * | 1/2006 | Prikhodko | H03F 1/302 330/285 |
| 8,648,656 | B2 | * | 2/2014 | Nozaki | H03F 1/0261 330/298 |
| 2016/0197586 | A1 | * | 7/2016 | Ripley | H03F 1/22 330/296 |

* cited by examiner

*Primary Examiner* — Steven J Mottola
(74) *Attorney, Agent, or Firm* — Knobbe, Martens, Olson & Bear, LLP (57) ABSTRACT

Systems, methods, and apparatuses for improving reliability and/or reducing or preventing breakdown of an amplifier, specifically breakdown of a transistor of an amplifier, are disclosed. A protection circuit can be electrically coupled to the amplifier, and can be configured to reduce a voltage swing at the amplifier. The amplifier can include a first transistor, and the protection circuit can include a second transistor electrically coupled to a control terminal of the first transistor of the amplifier. When a power at a control terminal of the second transistor of the protection circuit satisfies a threshold power, the protection circuit can be configured to reduce a power at a power terminal of the first transistor the amplifier. By reducing the voltage at the power terminal of the first transistor the amplifier, the protection circuit can allow the amplifier to operate safely, without breakdown.

20 Claims, 5 Drawing Sheets

BREAKDOWN PROTECTION CIRCUIT FOR POWER AMPLIFIER

FIELD OF DISCLOSURE

The present disclosure relates to improving amplifier reliability and more particularly to techniques for reducing or avoiding breakdown of a transistor in an amplifier.

BACKGROUND

Traditionally, Gallium Nitride (GaN), Gallium-Arsenide (GaAs), or Silicon-Germanium (SiGe) technologies dominated power amplifier (PA) design. However, a rising demand for higher integration and lower cost of mobile communication devices has steered a trend towards the use of less expensive technology in PA design, which has resulted in significant PA reliability issues.

SUMMARY OF THE DISCLOSURE

The innovations described in the claims each have several aspects, no single one of which is solely responsible for the desirable attributes. Without limiting the scope of the claims, some prominent features of this disclosure will now be briefly described.

The present disclosure enables improved amplifier protection, which improves the reliability of the amplifier by preventing or reducing breakdown of the amplifier. An apparatus according to the present disclosure can include an amplifier and a protection circuit. The protection circuit can be electrically coupled to a control terminal of the amplifier. The protection circuit can be configured to reduce a voltage swing at the amplifier. The reduction of the voltage swing can be based at least in part on detection of a threshold power at the control terminal of the amplifier.

The apparatus of the preceding paragraph may also include any combination of the following features described in this paragraph, among others described herein. The protection circuit can also be electrically coupled to a power terminal of the amplifier. The amplifier can include a transistor, and the control terminal can include a control terminal of the transistor of the amplifier. The protection circuit can include a transistor that corresponds to the transistor of the amplifier. A control terminal of the transistor of the protection circuit can be electrically coupled to the control terminal of the transistor of the amplifier. The protection circuit can further include one or more sensing elements. One or more sensing elements can be electrically coupled between the control terminal of the transistor of the protection circuit and the control terminal of the transistor of the amplifier. Any of the one or more sensing elements can include one or more of a capacitor, a resistor, an inductor, a diode, a metal-oxide-semiconductor field-effect transistor (MOSFET), a bipolar junction transistor (BJT), a transmission line, or a coupler.

The apparatus of any of the preceding paragraphs may also include any combination of the following features described in this paragraph, among others described herein. A power terminal of the transistor of the protection circuit can be electrically coupled to a power terminal of the transistor of the amplifier. The protection circuit can further include one or more sensing elements. One or more sensing elements can be electrically coupled between a power terminal of the transistor of the protection circuit and a power terminal of the transistor of the amplifier. Any of the one or more sensing elements can include one or more of a capacitor, a resistor, an inductor, a diode, a metal-oxide-semiconductor field-effect transistor (MOSFET), a bipolar junction transistor (BJT), a transmission line, or a coupler.

The apparatus of any of the preceding paragraphs may also include any combination of the following features described in this paragraph, among others described herein. The transistor of the amplifier can be a first transistor, and the amplifier can include a second transistor. The protection circuit can be electrically coupled to a control terminal of the second transistor of the amplifier. A first power terminal of the second transistor of the amplifier can be electrically coupled to a second power terminal of the first transistor of the amplifier. The second power terminal of the first transistor of the amplifier can be different from a first power terminal of the first transistor and/or can be different from the control terminal of the first transistor. The transistor of the protection circuit can be a first transistor of the protection circuit. The protection circuit can include a second transistor. In some cases, the protection circuit includes a replica circuit corresponding to a circuit of the amplifier. The replica circuit can include one or more transistors that match or correspond to one or more transistors of the amplifier, which can include at least the first transistor of the amplifier or the second transistor of the amplifier. The replica circuit can be configured to compensate for variations in at least one of process, voltage, and/or temperature of one or more transistors of the amplifier.

The apparatus of any of the preceding paragraphs may also include any combination of the following features described in this paragraph, among others described herein. To reduce the voltage swing at the amplifier, the protection circuit can be configured to reduce a voltage at a power terminal of the amplifier. Any of the transistors described herein can include a metal-oxide-semiconductor field-effect transistor (MOSFET). A first power terminal, a control terminal, and a second power terminal of any transistor described herein can correspond to a drain terminal, a gate terminal, and a source terminal, respectively, of the MOSFET. A first power terminal, a control terminal, and a second power terminal of any transistor described herein can correspond to a source terminal, a gate terminal, and a drain terminal, respectively, of the MOSFET. The voltage swing can be a voltage swing between a power terminal and another power terminal (for example, between the first power terminal and the second power terminal), or between a power terminal and a control terminal. For example, the voltage swing can be a voltage swing between a drain of the MOSFET and a source of the MOSFET, a voltage swing between a drain of the MOSFET and a gate of the MOSFET, or a voltage swing between a source of the MOSFET and a gate of the MOSFET. Any of the transistors described herein can include a complementary metal-oxide-semiconductor (CMOS).

The apparatus of any of the preceding paragraphs may also include any combination of the following features described in this paragraph, among others described herein. Any of the transistors described herein can include a bipolar junction transistor (BJT). A first power terminal, a control terminal, and a second power terminal of any transistor described herein can correspond to an emitter terminal, a base terminal, and a collector terminal, respectively, of the BJT. A first power terminal, a control terminal, and a second power terminal of any transistor described herein can correspond to a collector terminal, a base terminal, and an emitter terminal, respectively, or the BJT. The voltage swing can be a voltage swing between a power terminal and another power terminal (for example, between the first power terminal and the second power terminal), or between a power terminal and a control terminal. For example, the voltage swing can be a voltage swing between an emitter of the BJT and a collector of the BJT, a voltage swing between an emitter of the BJT and a base of the BJT, or a voltage swing between a collector of the BJT and a base of the BJT.

The present disclosure provides an improved protection circuit for an amplifier, which can improve the reliability of the amplifier, as well as prevent or reduce breakdown of the amplifier. A protection circuit according to the present disclosure can be configured to reduce a voltage swing at an amplifier. The protection circuit can include at least a first transistor and a second transistor. The first transistor of the protection circuit can include a first power terminal, a control terminal, and a second power terminal. The first power terminal of the first transistor of the protection circuit can be electrically coupled to a first power terminal of a first transistor of an amplifier via a first sensing element. The first control terminal of the first transistor of the protection circuit can be electrically coupled to a control terminal of the first transistor of the amplifier via a second sensing element. The second transistor of the protection circuit can include a first power terminal, a control terminal, and a second power terminal. The second power terminal of the second transistor of the protection circuit can be electrically coupled to the second power terminal of the first transistor of the protection circuit. The second power terminal of the first transistor of the protection circuit can be different from the first power terminal of the first transistor of the protection circuit. The second power terminal of the first transistor of the protection circuit can be different from the control terminal of the first transistor of the protection circuit. The control terminal of the second transistor of the protection circuit can be electrically coupled to a control terminal of a second transistor of the amplifier via a third sensing element. The protection circuit can be configured to reduce a voltage swing at the amplifier. The reduction of the voltage swing can be based at least in part on a voltage at the control terminal of the first transistor of the amplifier or a voltage at the control terminal of the second transistor of the amplifier.

The protection circuit of the preceding paragraph may also include any combination of the following features described in this paragraph, among others described herein. Any of the first transistor of the protection circuit, the second transistor of the protection circuit, the first transistor of the amplifier, or the second transistor of the amplifier can include a metal-oxide-semiconductor field-effect transistor (MOSFET). A first power terminal, a control terminal, and a second power terminal of any transistor described herein can correspond to a drain terminal, a gate terminal, and a source terminal, respectively, of the MOSFET. A first power terminal, a control terminal, and a second power terminal of any transistor described herein can correspond to a source terminal, a gate terminal, and a drain terminal, respectively, of the MOSFET. Any of the first transistor of the protection circuit, the second transistor of the protection circuit, the first transistor of the amplifier, or the second transistor of the amplifier can include a complementary metal-oxide-semiconductor (CMOS) transistor.

The protection circuit of any of the two preceding paragraphs may also include any combination of the following features described in this paragraph, among others described herein. Any of the first transistor of the protection circuit, the second transistor of the protection circuit, the first transistor of the amplifier, or the second transistor of the amplifier can include a bipolar junction transistor (BJT). A first power terminal, a control terminal, and a second power terminal of any transistor described herein can correspond to an emitter terminal, a base terminal, and a collector terminal, respectively, of the BJT. A first power terminal, a control terminal, and a second power terminal of any transistor described herein can correspond to a collector terminal, a base terminal, and an emitter terminal, respectively, or the BJT. Any of the first sensing element, the second sensing element, or the third sensing element can include one or more of a capacitor, a resistor, an inductor, a diode, a MOSFET, a BJT, a transmission line, or a coupler.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

Overview

Complementary metal-oxide-semiconductor (CMOS) power amplifiers (PAs) can allow for considerable cost and size reductions. However, many difficulties exist in exploiting PAs in radio frequency (RF) devices. For example, although CMOS PAs are relatively inexpensive as compared to GaN, GaAs, SiGe, and/or silicon bipolar PAs, many CMOS PAs suffer from significant reliability issues. For example, commercial PAs can demand a high voltage standing wave ratio (VSWR), and a strong mismatch condition associated with the high VSWR can result in high voltage peaks at the CMOS transistor. Because a CMOS transistor is vulnerable to breakdown (for example, of gate-oxide or PN-junction) if it is exposed to voltage exceeding a threshold voltage corresponding to a breakdown voltage of the transistor, CMOS PAs are more susceptible to breakdown in commercial and other implementations. Nonetheless, with increasing demand for lower costs, there is a growing trend towards the use of CMOS PAs in RF and other devices.

Some techniques for managing problems associated with voltages in excess of the normal operating voltage or a threshold operating voltage corresponding to a breakdown voltage include coupling a series of diodes to a power terminal of amplifier. For example, in some cases, swing voltages are greater than or equal to a diode's turn-on voltage (for example, the amount of positive voltage that must be applied across the diode in order for the diode to conduct current in the forward direction or "turn on"). Accordingly, these swing voltages can turn on the diodes, which can clip the signal and protect the amplifier. However, these techniques are not generally suitable in low voltage processes where, for example, the breakdown voltage of a transistor is less than the turn-on voltage of a diode. Accordingly, at least due to the small or nano-scale processes of a CMOS PA, the coupling of diodes to a power terminal of amplifier can be unsuitable for CMOS PA protection.

To address these and other problems, systems, methods, and apparatuses for improving reliability and/or reducing or preventing breakdown of an amplifier, specifically breakdown of a transistor of an amplifier, are disclosed. A protection circuit can be electrically coupled to the amplifier, and can be configured to reduce a voltage or a voltage swing at the amplifier. The amplifier can include a transistor, and the protection circuit can include a transistor electrically coupled to the amplifier's transistor. For example, a power terminal of the protection circuit's transistor can be electrically coupled to a power terminal of the amplifier's transistor and/or a control terminal of the protection circuit's transistor can be electrically coupled to a control terminal of the amplifier's transistor. When the amplifier experiences a voltage (for example, at the drain or control terminal of the transistor) that satisfies a threshold voltage corresponding to a breakdown voltage of the amplifier's transistor, at least some of the energy can be transferred to the protection circuit to reduce the voltage or voltage swing experienced by the amplifier. By reducing a voltage at the transistor of the amplifier, the transistor of the amplifier can continue to operate in a safe operating region. Accordingly, the protection circuit can advantageously protect the amplifier from breakdown due to voltages exceeding a breakdown voltage threshold, VSWR load variation, or the like. Furthermore, unlike the techniques for managing overvoltage described above, the protection circuit disclosed herein operates to protect the amplifier in low voltage processes, as well as high or intermediate voltage processes.

In addition to a reduction in reliability, the smaller feature size further can make CMOS circuits more vulnerable to process, supply voltage, and temperature (PVT) variability. Accordingly, some implementations of the present disclosure advantageously provide a protection circuit that can limit and/or compensate for PVT variability of the amplifier. For example, the protection circuit can track the circuit of the amplifier to compensate for the PVT variations. That is, an arrangement of at least a portion of the protection circuit can correspond to or match an arrangement of at least a portion of the circuit of the amplifier. Because the elements of the protection circuit can track the elements of the amplifier, if there are PVT variations, each element of the protection circuit can be affected by the PVT variations in the same way as its corresponding amplifier element. Accordingly, the protection circuit can offer the same protections and performance to the amplifier, even if PVT variations are present.

Although generally described herein as applicable to CMOS PAs, similar protection circuits or techniques can be utilized for other metal-oxide-semiconductor field-effect transistor (MOSFET) amplifiers, including but not limited to n-type MOS (NMOS) and p-type MOS (PMOS) amplifiers. In addition or alternatively, similar protection circuits or techniques can be utilized for bipolar junction transistor (BJT) amplifiers.

Over-Voltage

Load mismatches at an antenna can lead to reflections of a transmitted signal and thereby to standing waves. Amplitude and phase of the reflected signal can be quantified in terms of a reflection factor $\rho$. If the transmitted signal has an amplitude of $V_f$, the standing wave has a maximum amplitude of $V_{max}=V_f(1+|\rho|)$. Thus, the standing wave can reach twice the amplitude of the transmitted wave when strong mismatches apply. A measure for the load mismatch is the Voltage Standing Wave Ratio (VSWR), which is the ratio between maximum and minimum voltage of the standing wave. This ratio is illustrated in Equation 1.

$$VSWR = \frac{V_{max}}{V_{min}} = \frac{1+|\rho|}{1-|\rho|} \qquad \text{(Equation 1)}$$

High voltage standing waves can accelerate the long-term degradation of a CMOS PA or even lead to a breakdown of the CMOS transistor. Thus, as described herein, an obstacle to the exploitation of CMOS PAs, and other PAs, is the transistor's ability survive under high load voltage standing wave ratio (VSWR) conditions. Accordingly, systems, methods, and apparatuses are disclosed for improving reliability and/or reducing or preventing breakdown of a transistor of an amplifier by utilizing an improved protection circuit that limits a voltage or voltage swing at a transistor of the amplifier, thereby improving the reliability of the amplifier.

Protection Circuit

Figure 1:
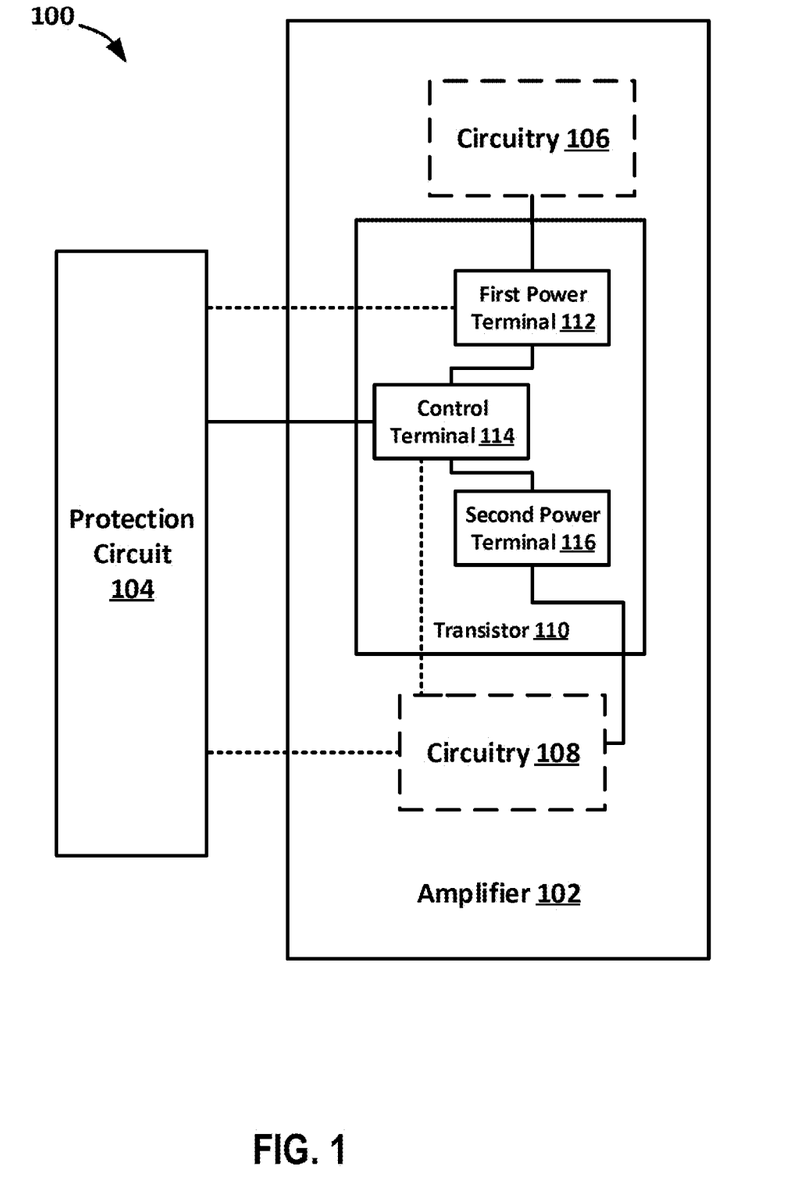
FIG. 1 is a diagram illustrating an embodiment of a system that includes an example protection circuit electrically coupled to an example amplifier.

FIG. 1 is a diagram illustrating an embodiment of a system 100 that includes an example protection circuit 104 electrically coupled to an example amplifier 102. The protection circuit 104 can be configured to reduce a voltage or voltage swing of the amplifier 102 to limit the amplifier from operating in a breakdown operating region corresponding to a breakdown voltage of the amplifier. As illustrated, the amplifier 102 includes a transistor 110, as well as circuitry 106 and circuitry 108.

The amplifier 102 can be configured to increase a power of a signal. For example, the amplifier 102 can be a radio frequency (RF) power amplifier (PA), which can convert a low-power RF signal into a higher power RF signal. The amplifier 102 can be configured to drive an antenna (not pictured) of a transmitter and/or transceiver (not pictured). In addition or alternatively, the amplifier 102 can be configured to increase a power of a signal received at an antenna (not pictured) of a receiver and/or transceiver (not pictured).

The amplifier 102 can include at least one transistor 110, which can be configured to amplify or switch electronic signals and/or electrical power. The transistor 110 can be composed of semiconductor material, and can include at least three terminals. For example, the transistor 110 can include a three or four terminal transistor, such as a metal-oxide-semiconductor field-effect transistor (MOSFET) (for example, an n-type MOS (NMOS), a p-type MOS (PMOS), or a complementary metal-oxide-semiconductor (CMOS)), a bipolar junction transistor (BJT), or the like. As illustrated in FIG. 1, the transistor 110 can include a first power terminal 112, a control terminal 114, and/or a second power terminal 116. In some cases, a voltage or current applied to one pair of the transistor's 110 terminals can control a current or voltage through another pair of terminals.

As described above, in some implementations, the transistor 110 can include a BJT. For example, the first power terminal 112, the control terminal 114, and the second power terminal 116 can correspond to the base terminal, the collector terminal, and the emitter terminal, respectively, of the BJT. Alternatively, the first power terminal 112, the control terminal 114, and the second power terminal 116 can correspond to the emitter terminal, the collector terminal, and the base terminal, respectively, of the BJT.

In addition or alternatively, in some implementations, the transistor 110 can include a MOSFET. More specifically, the transistor 110 can include a CMOS transistor. For example, the first power terminal 112, the control terminal 114, and the second power terminal 116 can correspond to the drain terminal, the gate terminal, and the source terminal, respectively, of the MOSFET. Alternatively, the first power terminal 112, the control terminal 114, and the second power terminal 116 can correspond to the source terminal, the gate terminal, and the gate terminal, respectively, of the MOSFET.

The amplifier 102 can include circuitry 106 and/or circuitry 108. The circuitry 106 can provide an interface between the amplifier 102 and an antenna. In addition or alternatively, the circuitry 106 can include output matching circuitry. For example, the circuitry 106 can be configured to adjust impedance to produce an optimum or desired power. The circuitry 106 or 108 can include one or more transistors (for example, a transistor that is electrically coupled to transistor 110 such as, by coupling the first power terminal 112 or the second power terminal 116 of the transistor 110 to a power terminal of a transistor of the circuitry 106 or 108 (for example, a source terminal or drain terminal if a CMOS transistor, or a collector terminal or an emitter terminal if a BJT)), input matching circuitry, biasing circuitry, or the like. Although the circuitry 106 and circuitry 108 are illustrated as integrated within the amplifier 102, in some implementations, some or all of the circuitry 106 and/or the circuitry 108 is not included in the amplifier 102. For example, some of all of the circuitry 106 and/or some or all of the circuitry 108 can be separate from, but electrically coupled to, the amplifier 102 and/or the protection circuit 104. The circuitry 106 and/or circuitry 108 can be electrically coupled to each other, or electrically coupled to one or more of the first power terminal 112, the control terminal 114, the second power terminal, or the protection circuit. In addition or alternatively, some of all of the circuitry 106 and/or some or all of the circuitry 108 can be excluded from the system 100.

The protection circuit 104 can be configured to, among other things, protect the amplifier 102 by preventing or limiting breakdown of the transistor 110. As described herein, load mismatches at an antenna or other element can induce a voltage at the transistor that exceeds a threshold voltage corresponding to a breakdown voltage of the transistor, which can eventually or immediately lead to breakdown of the transistor 110. This can also be the case if the load mismatches lead to VSWRs that exceed a threshold VSWR corresponding to breakdown of the transistor. Accordingly, the protection circuit 104 can protect the amplifier 102 by reducing a voltage swing at the transistor, reducing a VSWR, reducing an effect of variation in VSWR, or reducing voltage or current at one or more terminals of the transistor 110 of the amplifier 102. As illustrated, the protection circuit 104 can be in electrical communication with control terminal 114 of the transistor 110. In addition or alternatively, the protection circuit 104 can be in electrical communication with one or more of first power terminal 112, second power terminal 114, circuitry 108 or circuitry 106.

In some implementations, as illustrated in FIG. 1, the protection circuit 104 is separate from, but in electrical communication with, the amplifier 102. Alternatively, the protection circuit 104 and amplifier 102 can be integrated such that the amplifier 102 includes some or all of the protection circuit 104.

Transistor Stacking

Figure 2:
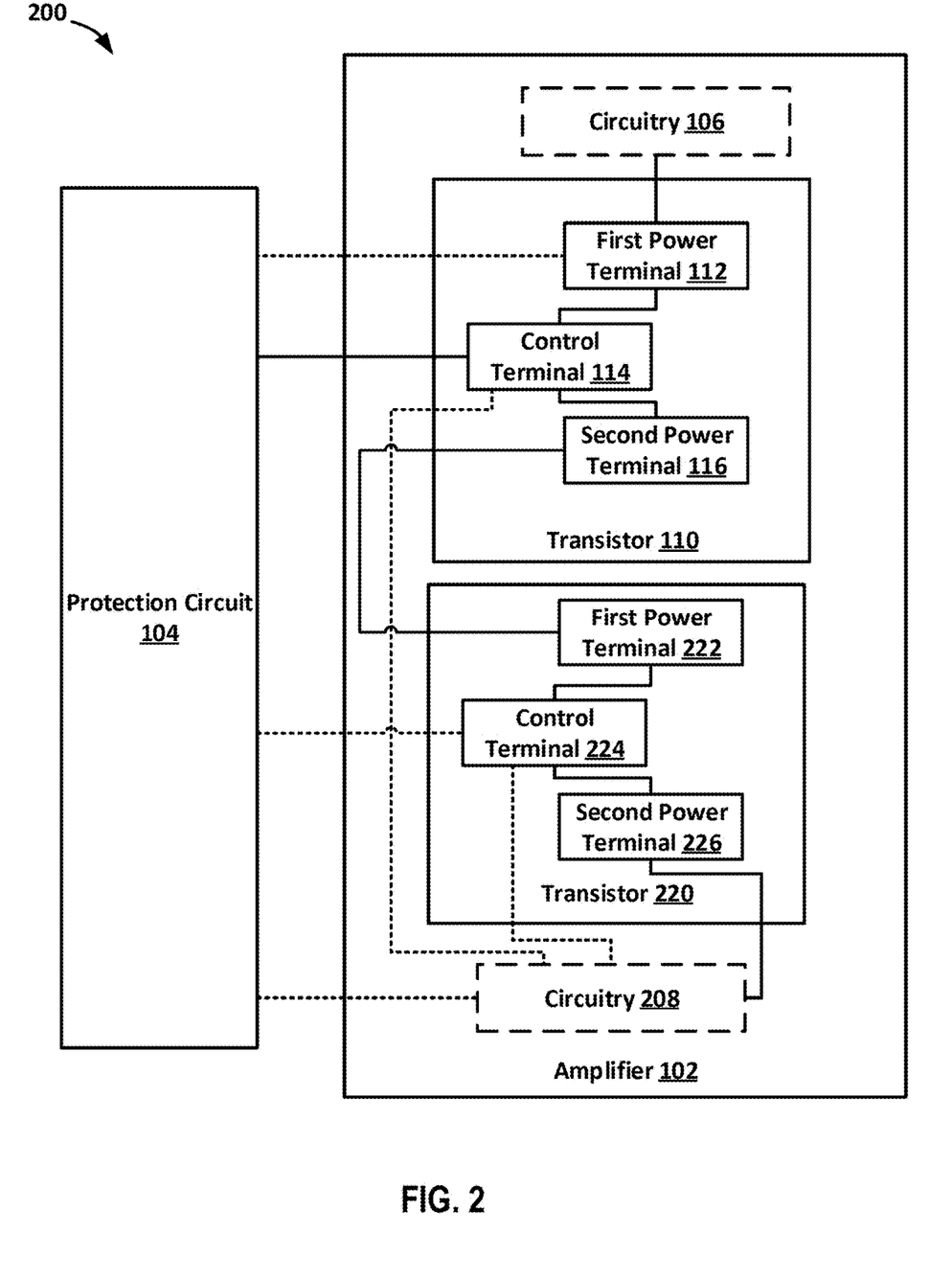
FIG. 2 is a diagram illustrating an embodiment of a system that includes an example protection circuit and an example amplifier having multiple transistors.

FIG. 2 is a diagram illustrating an embodiment of a system 200 that includes an example protection circuit 104 and an example amplifier 102 having multiple transistors 110, 220. The protection circuit 104 can be configured to prevent or reduce a likelihood of breakdown of one or more of the transistors 110, 220. The system 200 can include any one or any combination of the features described with respect to system 100 of FIG. 1. For example, the system 200 can include the protection circuit 104, the first transistor 110, or circuitry 106. In addition, as illustrated in FIG. 2, the system 200 can include a second transistor 220 in electrical communication with the first transistor, and can further include circuitry 208. In some cases, circuitry 108 of FIG. 1 can include the second transistor 220 and/or circuitry 208.

Similar to the first transistor 110 of the amplifier 102, the second transistor 220 of the amplifier 102 can be configured to amplify or switch electronic signals and/or electrical power. The transistor 220 can be composed of semiconductor material, and can include at least three terminals. For example, the transistor 220 can include a three or four terminal transistor, such as a MOSFET (for example, an NMOS, PMOS, or a CMOS), a BJT, or the like. As illustrated in FIG. 2, the transistor 220 can include a first power terminal 222, a control terminal 224, and/or a second power terminal 226. In some cases, a voltage or current applied to one pair of the transistor's 220 terminals can control a current or voltage through another pair of terminals.

In the illustrated embodiment, the first transistor 110 is connected in series with (also referred to as stacked) the second transistor 220. In some instances, this serial connection can be referred to as a stacked arrangement between the first transistor 110 and the second transistor 220, due to the appearance that the first transistor 110 is stacked on or on top of the second transistor 220. In some cases, serially connecting or stacking the transistors 110, 220 can allow the amplifier 102 to achieve a higher output power, without causing breakdown of either of the transistors 110, 220. For example, a particular impedance for the control terminal 112, 224 of each stacked transistor 110, 220 can result in a voltage swing that can be divided equally across the transistors 110, 220, and allow higher power with higher supply voltages. In some cases, a capacitor can be electrically coupled between the control terminal 112 or 224 and ground, and can act as a voltage divider, which is described in more detail with respect to FIG. 4. Although only two transistors 110, 220 are illustrated in the stacked arrangement, more transistors can be included in the stack.

One or both transistors 110 and 220 can be matched for a threshold power impedance (sometimes referred to as R-opt), which in some cases, can be a desired or maximum power impedance, or a threshold efficiency, which in some embodiments can be a maximum efficiency. In some cases, by matching a transistor 110, 220 for R-opt, the system 200 can achieve a desired output power (for example, a threshold output power, a maximum output power, etc.) and/or a desired efficiency (for example, a threshold efficiency, a maximum efficiency, etc.) for each transistor 110, 220. For example, with respect to a CMOS transistor, when the drain-source voltage, $V_{ds}$, (i.e., the voltage that falls across the drain-source terminal of the transistor) is equal to the output voltage ($V_o$), and with power matching, the maximum voltage swing across device is approximately $2*V_o$. To avoid breakdown because of a voltage between drain-source voltage, if $V_{ds}$ exceeds a threshold voltage, the system 200 can limit the voltage swing between the drain terminal and the source terminal to be less than a breakdown voltage, $BV_{DS}$. The breakdown voltage, $BV_{DS}$, of the transistor can be the drain-source voltage, $V_{ds}$, that causes the transistor to enter a breakdown operating region. The breakdown operating region includes the region where the transistor receives too much voltage or current across its drain-source terminal, which causes the drain-source terminal to break down.

In some cases, such as high voltage processes, the some protection circuits can include one or more diodes, which can be electrically coupled to a first power terminal of a first transistor. By adding the diodes at output, any extra swing above a desired voltage can turn on diodes, which can clip in signal. However, this technique may not be useful for nano-scale CMOS process with low breakdown voltages. For example, give a 28 nm CMOS process, a breakdown voltage, $BV_{DS}$, of approximately 0.65 volts, an AC breakdown of approximately 1.2 volts, and a 1 volt large signal swing across single transistor under 50 ohm load impedance, the transistor is approximately 200 mV away from breakdown. Thus, a diode turn-on voltage of approximately 500 mV to 800 mV would not protect the transistor from breakdown. In contrast, the protection circuit 104 can advantageously protect transistor(s) of the amplifier despite low breakdown voltages.

Figure 3:
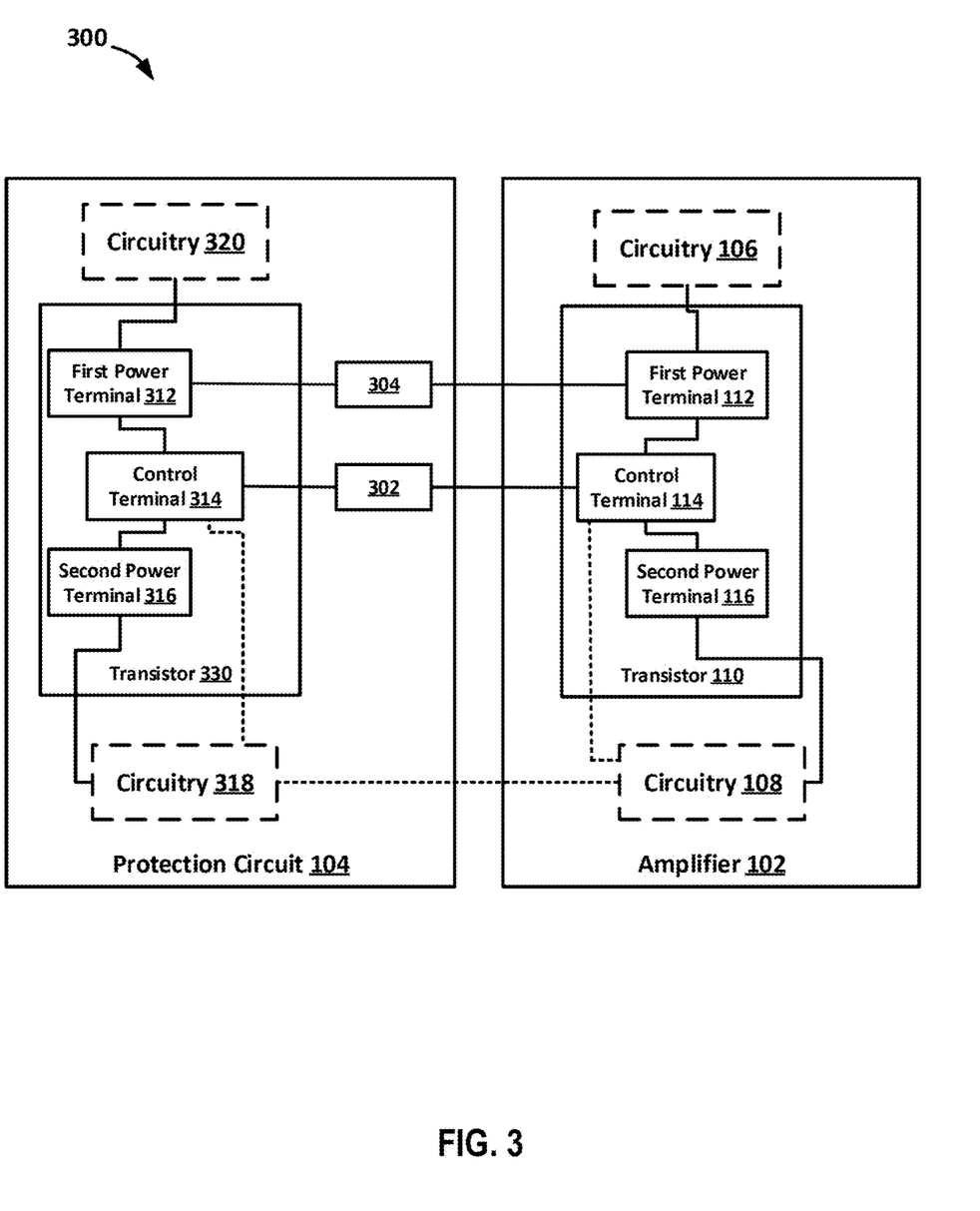
FIG. 3 is a diagram illustrating an embodiment of a system that includes an example amplifier and an example protection circuit that includes at least one transistor.

FIG. 3 is a diagram illustrating an embodiment of a system 300 that includes an example amplifier 102 and an example protection circuit 104 that includes at least one transistor 330. The system 300 can include any one or any combination of the components described with respect to systems 100 or 200 of FIGS. 1 and 2, respectively. For example, the amplifier 102 can include the transistor 110, circuitry 106, and circuitry 108. In addition, the protection circuit 104 can include a transistor 330, circuitry 318, circuitry 320, and/or one or more sensing elements 302, 304.

Similar to the transistor 110 of the amplifier 102, the transistor 330 of the protection circuit 104 can be configured to amplify or switch electronic signals and/or electrical power. The transistor 330 can be composed of semiconductor material, and can include at least three terminals. For example, the transistor 330 can include a three or four terminal transistor, such as a MOSFET (for example, an NMOS, PMOS, or a CMOS), a BJT, or the like. As illustrated in FIG. 3, the transistor 330 can include a first power terminal 312, a control terminal 314, and/or a second power terminal 316. In some cases, a voltage or current applied to one pair of the transistor's 330 terminals can control a current or voltage through another pair of terminals.

The transistor 330 of the protection circuit 104 can be electrically coupled to the transistor 110 of the amplifier. For example, the first power terminal 312 of the transistor 330 can be electrically coupled to the first power terminal of the transistor 110 via a sensing element 304. Similarly, the control terminal 314 of the transistor 330 can be electrically coupled to the control terminal of the transistor 114 via a sensing element 302. The sensing elements 302, 304 can be resistive, capacitive, inductive, or impedance elements. For example, the sensing elements 302, 304 can include one or more of a capacitor, a resistor, an inductor, a diode, a MOSFET, a BJT, a transmission line, a coupler, or the like.

As described in more detail below, the voltage at the control terminal 114 can be a function of the voltage at the first power terminal 112 and/or the capacitance between the control terminal 114 and the first power terminal 112. In addition, the voltage at the control terminal 314 can be a function of the impedance of the sensing element 302 and/or the voltage at the control terminal 114. Similarly, the voltage at the first power terminal 312 can be a function of the impedance of the sensing element 304 and/or the voltage at the first power terminal 112. Accordingly, the impedance or size of the sensing elements 302, 304 can affect the operation of the protection circuit 102 by controlling how much power is removed from the amplifier 102. That is, higher impedance at the sensing element 302 or 304 can result in a higher voltage threshold before the protection circuit begins removing voltage at the amplifier. In contrast, lower impedance at the sensing element 302 or 304 can result in a lower voltage threshold before the protection circuit begins removing voltage at the amplifier.

A benefit of using the topology of FIG. 3 is that when the voltage at the transistor 110 increases to a voltage that satisfies a threshold breakdown voltage of the transistor 100, the protection circuit 102 can reduce that voltage at the transistor 110 so that the voltage at the transistor 110 does not exceed that threshold breakdown voltage. In other words, the protection circuit 102 can maintain the operation of the transistor 110 an operating region other than the breakdown operating region. Similarly, if the transistor 110 is operating such that a voltage between the first power terminal 112 and second power terminal 114 is below a breakdown voltage of the transistor, the voltage at the control terminal 314 of the protection circuit 102 can be low enough that the transistor 330 of the protection circuit is not activated or turn-on, and thus the protection circuit 102 does not reduce, or does not substantially reduce, power from the amplifier 102 while it is operating.

For example, the amplifier 102 can experience a voltage at the first power terminal 112, which can induce a voltage at the control terminal 114. Furthermore, a voltage at the control terminal 314 is induced based at least in part on the sensing element 302 and the voltage at the control terminal 114. If the voltage between the control terminal 314 and the second power terminal 316 (for example, the gate-to-source voltage of a CMOS transistor) satisfies a minimum voltage needed to create a conducting path between the source terminal 316 and the drain terminal 312, then a drain current can flow from the drain terminal 312 to the source terminal 316, resulting in a reduction in voltage or power at the power terminal 112 of the amplifier. Thus, if the voltage at the power terminal 112 satisfies a threshold voltage, at least some of the energy at the transistor 110 can be transferred to the protection circuit 104 through the transistor 330 to reduce the voltage or voltage swing experienced by the transistor 110 of the amplifier 102. By reducing a voltage at the transistor 110 of the amplifier 102, the transistor can continue to operate such that a voltage between the first power terminal 112 and second power terminal 114 is below a breakdown voltage of the transistor. Accordingly, the protection circuit can advantageously protect the amplifier from breakdown due to voltages in excess of the normal operating voltage or a threshold operating voltage corresponding to a breakdown voltage.

Figure 4:
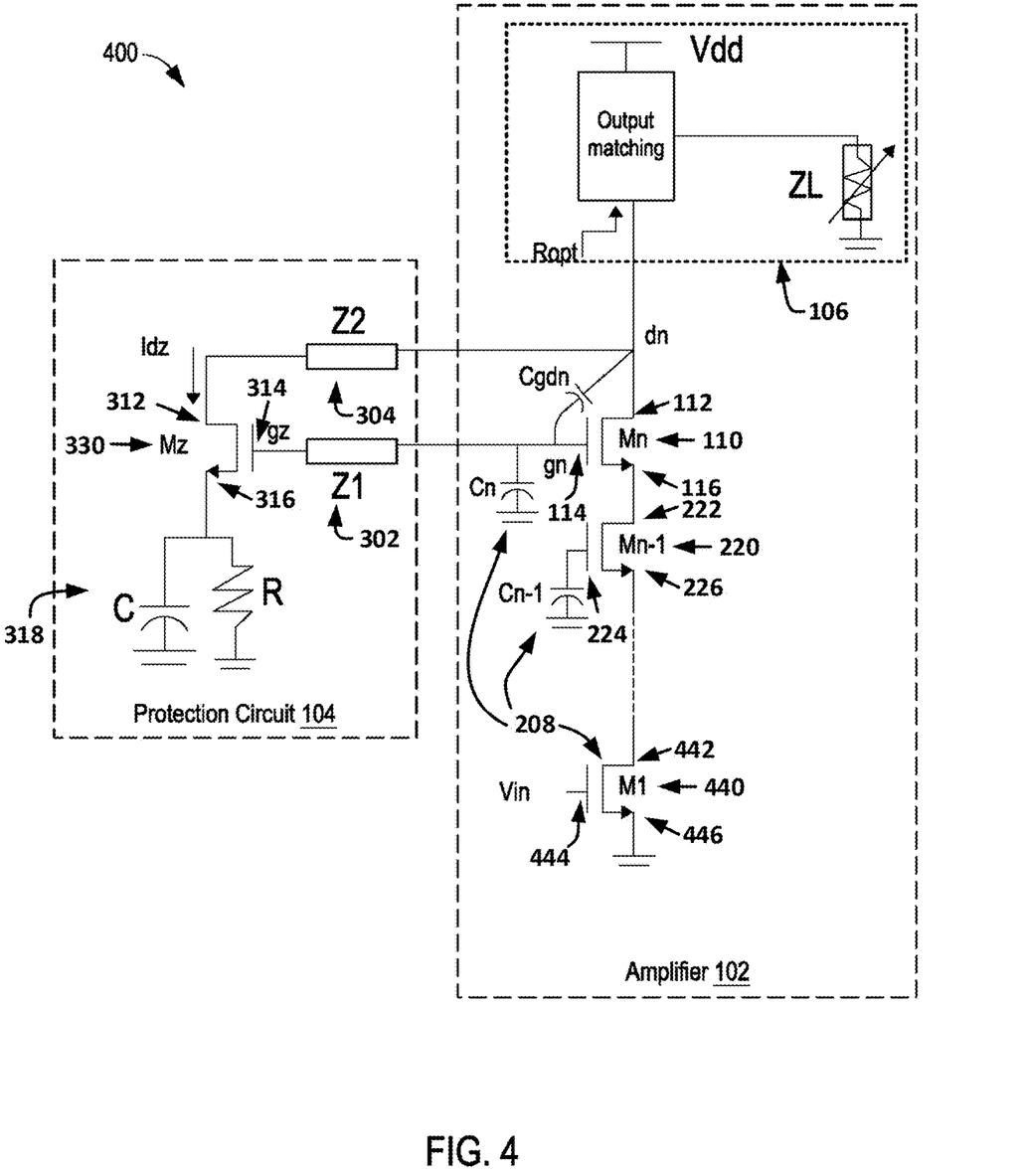
FIG. 4 is a diagram illustrating an embodiment of a system that includes an example amplifier and an example protection circuit.

FIG. 4 is a diagram illustrating an embodiment of a system 400 that includes an example amplifier 102 and an example protection circuit 104. The system 400 can include any one or any combination of the components described with respect to systems 100, 200, or 300 of FIGS. 1, 2, and 3, respectively. For example, the system 400 can include the amplifier 102 and the protection circuit 104. The amplifier 102 can include a first transistor 110, a second transistor 220, circuitry 106, and circuitry 208. The protection circuit 104 can be electrically coupled to the amplifier, and can include sensing elements 302 and 304, a transistor 330, and circuitry 318.

In CMOS transistors, at least three device-specific capacitances exist between terminals: capacitance for gate-source, gate-drain, and drain-source. In the example of FIG. 4, the circuitry 208 of the amplifier 102 includes a capacitor, Cn, electrically coupled between ground and the gate terminal 114 of the first transistor 110 of the amplifier 102. Assuming the impedance Z1 of sensing element 302 and the impedance Z2 of sensing element 304 is high, the capacitor, Cn, can perform similar to a voltage divider in that the gate voltage $V_{gn}$ (measured at the gate terminal 114) can be represented by Equation 2, in which $V_{dn}$ is the drain voltage at the drain terminal 112 of the transistor 110, $C_{gdn}$ is the device-specific gate-drain capacitance, and $C_n$ is the capacitance at capacitor Cn of circuitry 208.

$$V_{gn} = V_{dn} * \frac{C_{gdn}}{C_{gdn} + C_n} \quad \text{(Equation 2)}$$

As illustrated, the circuitry 208 can additionally or alternatively include a capacitor, Cn−1, electrically coupled between ground and the gate terminal 224 of the second transistor 220 of the amplifier 102. Accordingly, in the illustrated implementation, a relationship similar to Equation 2 exists between the voltage at the drain terminal 222 of the transistor 220 and the voltage at the gate terminal 224 of the transistor 220.

In addition, the circuitry 208 can include a transistor 440. The drain terminal 442 of transistor 440 can be electrically coupled to the source terminal 226 of the second transistor 220. The gate terminal 444 can configured to receive an input signal, Vin. The source terminal 446 can be electrically coupled to a ground.

The circuitry 318 of the protection circuit 104 can include an RC circuit, which can include at least one resistor, R, and at least one capacitor, C. The circuitry 318 can be electrically coupled between the source terminal 316 of the transistor 330 of the protection circuit 104 and a ground.

As described herein, the protection circuit 104 can include one or more sensing elements, such as sensing elements 302, 304. For example, the sensing element 302 can be electrically coupled between the gate terminal 114 of the transistor 110 of the amplifier 102 and the gate terminal 314 of the transistor 330 of the protection circuit 102. Accordingly, the gate voltage $V_{gz}$ of the transistor 330 (which can be measured at the gate terminal 314) can be a function of the impedance Z1 of the sensing element 302. For example, the gate voltage $V_{gz}$ can be a scale factor of the gate voltage $V_{gn}$, and can be represented by Equation 3, in which scale_factor_1 is a function of the impedance Z1 of the sensing element 302.

$$V_{gz} = \text{scale\_factor\_1} * V \quad \text{(Equation 3)}$$

Similarly, the sensing element 302 can be electrically coupled between the drain terminal 112 of the transistor 110 of the amplifier 102 and the drain terminal 312 of the transistor 330 of the protection circuit 102. Accordingly, the drain voltage $V_{dz}$ of the transistor 330 (which can be measured at the gate terminal 312) can be a function of the impedance Z2 of the sensing element 304. For example, the drain voltage $V_{dz}$ can be a scale factor of drain voltage $V_{dn}$, and can be represented by Equation 4, in which scale_factor_2 is a function of the impedance Z2 of the sensing element 304.

$$V_{dz} = \text{scale\_factor\_2} * V_{dn} \quad \text{(Equation 4)}$$

The source voltage $V_{sz}$ is the voltage at the source terminal 316 of the transistor 330 of the protection circuit 104 and can be a constant value, for example, with proper R & C values.

The drain current $I_{dz}$ can be described as the current flow between the drain terminal 312 and the source terminal 316 of the transistor 330 of the protection circuit 104, and the threshold voltage $V_{th}$ can be described as a minimum gate-to-source voltage $V_{gs}$ that is needed to create a conducting path between the source terminal 316 and drain terminal 312. When the transistor 330 is operating in the saturated region, the drain current $I_{dz}$ can be represented by Equation 5, in which $I_{dz} \uparrow$ is an increasing drain current $I_{dz}$, $v_{gz} \uparrow$ is an increase in gate voltage $v_{gz}$ of the transistor 110, $v_{th}$ is a threshold voltage of the transistor 110, λ is a channel length modulation parameter (generally in $V^{-1}$), and $V_{dz} \uparrow$ is an increase in drain voltage $V_{dz}$ of the transistor 110.

$$I_{dz}\uparrow = \frac{k}{2}(v_{gz}\uparrow - v_{th})^2 * (1 + \lambda * V_{dz}\uparrow) \quad \text{(Equation 5)}$$

Many short channel devices operate in velocity saturation region. When the transistor 330 is operating in the velocity saturated region, the drain current $I_{dz}$ can be represented by Equation 6, in which $I_{dz}$ is the current between the drain terminal 312 and the source terminal 316 of the transistor 330, w is transistor width, $V_{sat}$ is carriers velocity saturation (in m/s), $v_{gz} \uparrow$ is an increase in gate voltage $v_{gz}$ of the transistor 110, $v_{th}$ is a threshold voltage of the transistor 110, λ is a channel length modulation parameter (generally in $V^{-1}$), and $V_{dz} \uparrow$ is an increase in drain voltage $V_{dz}$ of the transistor 110.

$$I_{dz} = w * v_{sat} * (v_{gz}\uparrow - v_{th}) * (1 + \lambda * V_{dz}\uparrow) \quad \text{(Equation 6)}$$

As demonstrated by the relationships above, the protection circuit 102 can advantageously protect the transistor 110 from breakdown. For example, by properly scaling or choosing a size of the transistor 330 of the protection circuit, the impedance Z1 of sensing element 302 and the impedance Z2 of sensing element 304, the protection circuit can be configured to protect the amplifier 102 by limiting the drain-source voltage $V_{ds}$ of transistor 110 of the amplifier, such that the transistor 110 operates in a safe operating region. Accordingly, under normal conditions, the protection circuit can be off or otherwise not activate. That is, when the transistor 110 is operating in a safe operating region, the protection circuit 102 can be off and, in some cases, is not reducing the power of the transistor 110. In contrast, when the voltage swing at the transistor 220 increases such that the transistor 220 is operating out of a safe operating regions, the protection circuit 102 can be configured to turn on to protect the amplifier 102, thereby reducing the voltage swing at the transistor 110 such that transistor 110 will operate in the safe operating region.

For example, a change in VSWR or ZL induces a change in the drain voltage $V_{dn}$ at the drain terminal 112. For example, as VSWR increases, the drain voltage $V_{dn}$ can also increase. The increase in drain voltage $V_{dn}$ induces in an increase in drain voltage $V_{dz}$ at resistor 330, as well as an increase in gate voltage $V_{gn}$ at the transistor 110 and an increase in gate voltage $V_{gz}$ at the transistor 330. If the VSWR is high enough to result in a gate voltage $V_{gn}$ that activates the transistor 330, then the change in VSWR also induces a drain current $I_{dz}$ to flow through the transistor 330, which transfers at least some of the energy from the transistor 110 to and through the protection circuit 104, thereby causing a decrease in the drain voltage $V_{dn}$ at the drain terminal 112. Accordingly, the protection circuit 104 can advantageously provide a method of power dissipation to the transistor 110, in that the protection circuit 104 can limit or reduce the drain voltage $V_{dn}$ or the drain-source voltage $V_{ds}$ of the amplifier 102 when drain voltage $V_{dn}$ satisfies a threshold voltage. In some cases, the size and/or impedance of the sensing elements 302 and 304 can be adjusted to modify the threshold voltage. In other words, impedance value or size of the sensing elements 302 and 304 can determine the maximum voltage allowed at the drain terminal 112 of the amplifier 102.

PVT Compensation

Figure 5:
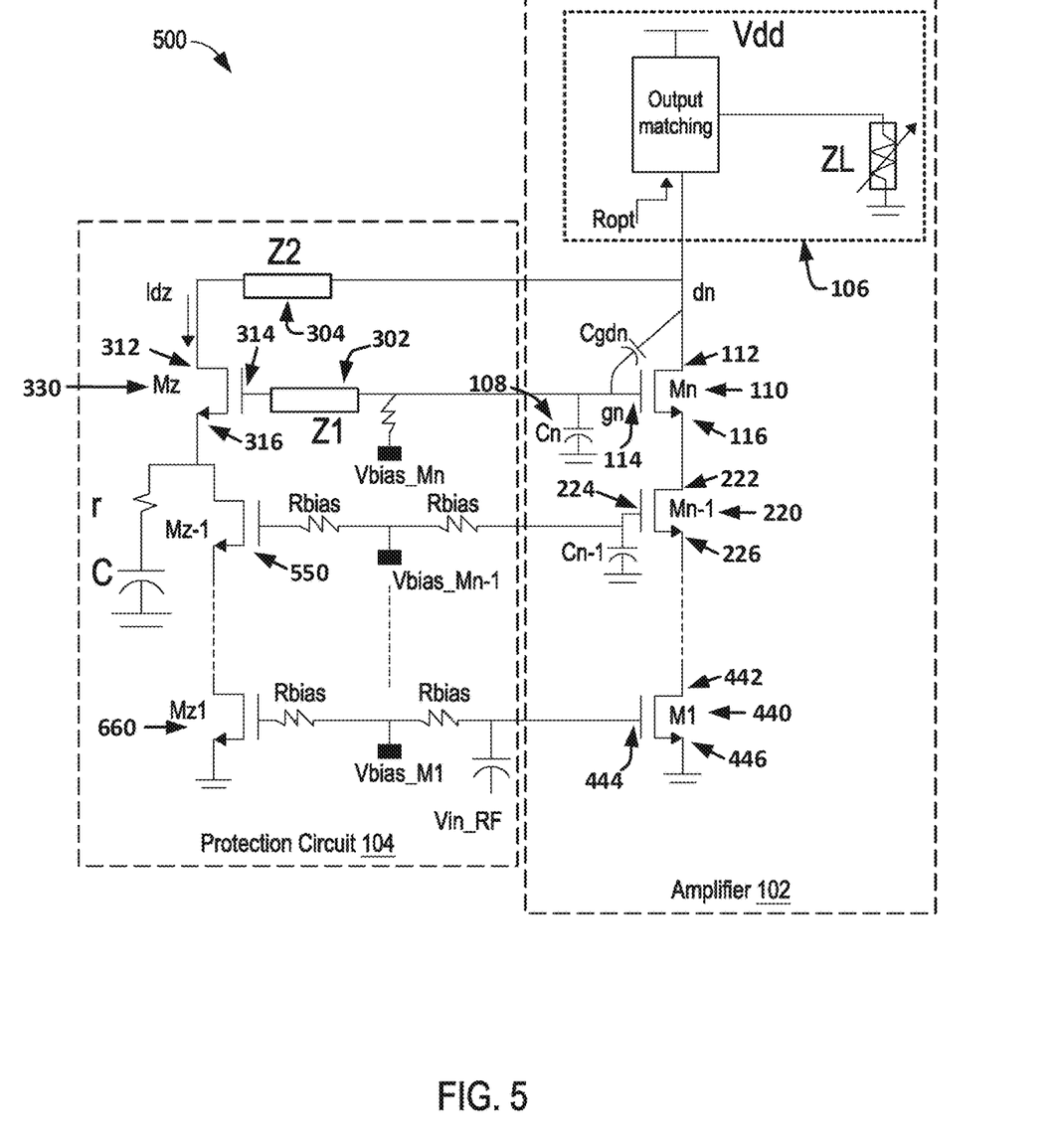
FIG. 5 is a diagram illustrating an embodiment of a system that includes an example amplifier and an example protection circuit.

FIG. 5 is a diagram illustrating an embodiment of a system 500 that includes an example amplifier 102 and an example protection circuit 104. The system 500 can include any one or any combination of the components described with respect to systems 100, 200, 300, or 400 of FIGS. 1, 2, 3, and 4, respectively. For example, the system 500 can include the amplifier 102 and the protection circuit 104.

CMOS circuits can be vulnerable to process, supply voltage, and temperature (PVT) variability than other circuits. Among other things, the PVT variability can affect the breakdown voltage of a particular transistor. For example, even transistors of the same make and model can have different breakdown voltages based at least in part on PVT variation. Accordingly, in some cases, the protection circuit 104 can limit and/or compensate for PVT variability associated with the amplifier 102. For example, at least a portion of the protection circuit 104 can track the circuit of the amplifier 102 to compensate for the PVT variations. That is, at least a portion of the protection circuit 104 can correspond to or match at least a portion of the circuit of the amplifier 102 such that the protection circuit 104 can include an identical arrangement of at least some of the components of the circuit of the amplifier 102.

By tracking the amplifier with an identical arrangement of components (for example, matching transistor 330 with transistor 110, matching transistor 550 with transistor 220, and/or matching transistor 660 with transistor 440), the protection circuit 102 can provide protections to the amplifier that ensure that, if there are PVT variations, each transistor of a particular transistor pair (for example, transistors 110 and 330, transistors 220 and 550, and/or transistors 440 and 660) can be affected by the PVT variations in the same way. Accordingly, if PVT variations cause the breakdown voltage of transistor 220 to be reduced, then the PVT variations will similarly cause the breakdown voltage of transistor 550 to be reduced. Because transistor 550 tracks transistor 220, and will be affected in the same way by the PVT variations, transistor 550 can offer the same protections and performance to transistor 220 that transistor 330 provides transistor 110, as described herein.

As illustrated, the protection circuit 104 can include a bias circuit (for example, Rbias or Vbias) between the gates of one or more of the transistor pairs. For example, the bias circuit, such as the resistors, Rbias, can isolate the amplifier 102 from the protection circuit 104. In addition, the Vbias can be a direct current voltage deliberately applied between the transistor pair for the purpose of controlling each of the transistors. It should be noted that the protection circuit could use any of a variety of biasing techniques, including but not limited to, current sources, R over R from Vdd, or the like.

The concepts described with respect to FIG. 5 are compatible with and can be used in conjunction with any combination of the embodiments and/or features described herein, such as those associated with any of FIGS. 1-4.

Terminology

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, systems, devices, and integrate circuits described herein may be embodied in a variety of other forms; furthermore, various omissions, substitutions and changes in the form of the methods, apparatus, and systems described herein may be made without departing from the spirit of the disclosure.

The claims presented herein are in single dependency format suitable for filing at the United States Patent & Trademark Office. However, it is to be assumed that each one of the claims can be multiply dependent on any preceding claim except where that is technically unfeasible.

What is claimed is:

1. An apparatus comprising:
   an amplifier; and
   a protection circuit comprising a transistor, wherein the transistor is a physical transistor, wherein a control terminal of the transistor is electrically coupled to a control terminal of the amplifier, wherein a power terminal of the transistor is electrically coupled to a power terminal of the amplifier, wherein the protection circuit is configured to reduce a voltage swing at the amplifier based at least in part on a presence of a threshold power at the control terminal of the amplifier or the power terminal of the amplifier.

2. The apparatus of claim 1, wherein the transistor is a first transistor, wherein the amplifier comprises a second transistor, wherein the control terminal of the amplifier is a control terminal of the second transistor, and wherein the power terminal of the amplifier is a power terminal of the second transistor.

3. The apparatus of claim 1, wherein the transistor is a first transistor, wherein the amplifier comprises a second transistor that is a complementary metal-oxide-semiconductor (CMOS) transistor, wherein the voltage swing is a voltage swing between a drain of the second transistor and a source of the second transistor.

4. The apparatus of claim 1, wherein the protection circuit further comprises at least one of:
a first sensing element electrically coupled between the control terminal of the transistor and the control terminal of the amplifier; or
a second sensing element electrically coupled between the power terminal of the transistor and the power terminal of the amplifier.

5. The apparatus of claim 4, wherein at least one of the first sensing element or the second sensing element comprises a capacitor, a resistor, an inductor, a diode, a metal-oxide-semiconductor field-effect transistor (MOSFET), a bipolar junction transistor (BJT), a transmission line, or a coupler.

6. The apparatus of claim 1, wherein the transistor is a first transistor and the amplifier comprises a second transistor and a third transistor in a stacked arrangement such that a power terminal of the second transistor is electrically coupled to a power terminal of the third transistor, wherein the control terminal of the amplifier is a control terminal of the second transistor.

7. The apparatus of claim 1, wherein the transistor is a first transistor, wherein the power terminal of the first transistor is a first power terminal of the first transistor, and wherein the protection circuit further comprises a second transistor in a stacked arrangement with the first transistor such that a second power terminal of the first transistor is electrically coupled to a power terminal of the second transistor.

8. A protection circuit configured to prevent breakdown of an amplifier, the protection circuit comprising:
a first transistor including:
a control terminal electrically coupled to a control terminal of a second transistor of an amplifier, and
a power terminal electrically coupled to a power terminal of the second transistor of the amplifier; and
a sensing element electrically coupled between the control terminal of the first transistor and the control terminal of the second transistor or the power terminal of the first transistor and the power terminal of the second transistor,
wherein the first transistor is a physical transistor,
wherein the protection circuit is configured to reduce a voltage swing at the power terminal of the amplifier based at least in part on a presence of a threshold power at the control terminal of the first transistor.

9. The protection circuit of claim 8, wherein the power terminal of the second transistor is a first power terminal of the second transistor, wherein the amplifier comprises a third transistor in a stacked arrangement with the second transistor such that a second power terminal of the second transistor is electrically coupled to a power terminal of the third transistor, the protection circuit further comprising:
a fourth transistor including a control terminal electrically coupled to a control terminal of the third transistor.

10. The protection circuit of claim 9, wherein the power terminal of the first transistor is a first power terminal of the first transistor, wherein the fourth transistor comprises a power terminal electrically coupled to a second power terminal of the first transistor.

11. The protection circuit of claim 8, wherein the first transistor comprises a complementary metal-oxide-semiconductor (CMOS) transistor, wherein the control terminal comprises a gate terminal of the CMOS transistor.

12. A system comprising:
an amplifier comprising a first transistor and a second transistor in a stacked arrangement such that a power terminal of the second transistor is electrically coupled to a power terminal of a third transistor; and
a protection circuit comprising the third transistor, wherein a control terminal of the third transistor is electrically coupled to a control terminal of the first transistor, wherein the protection circuit configured to reduce a voltage swing at the amplifier based at least in part on a presence of a threshold power at the control terminal of the first transistor or a power terminal of the first transistor.

13. The system of claim 12, wherein to reduce the voltage swing at the amplifier, the protection circuit is configured to reduce a voltage at the power terminal of the first transistor.

14. The system of claim 12, wherein the first transistor is a complementary metal-oxide-semiconductor (CMOS) transistor, wherein the control terminal of the first transistor is a gate terminal of the CMOS transistor, wherein the power terminal of the first transistor is a drain terminal of the CMOS transistor, wherein the voltage swing comprises a voltage swing between the drain terminal of the CMOS transistor and a source terminal of the CMOS transistor.

15. The system of claim 12, wherein the third transistor is a complementary metal-oxide-semiconductor (CMOS) transistor, wherein the control terminal of the third transistor is a gate terminal of the CMOS transistor, wherein the control terminal of the third transistor is electrically coupled to the control terminal of the first transistor via a first sensing element.

16. The apparatus of claim 1, wherein to reduce the voltage swing at the amplifier, the protection circuit is configured to dissipate at least some power associated with the voltage swing.

17. The system of claim 12, wherein to reduce the voltage swing at the amplifier, the protection circuit is configured to dissipate at least some power associated with the voltage swing.

18. The apparatus of claim 1, wherein the transistor is a first transistor, wherein the control terminal of the amplifier is a control terminal of a first transistor of the amplifier, wherein the power terminal of the amplifier is a power control terminal of the first transistor of the amplifier, wherein the protection circuit further comprises a second transistor, wherein a control terminal of the second transistor is electrically coupled to a control terminal of a second transistor of the amplifier, wherein a power terminal of the second transistor is electrically coupled to a power terminal of the second transistor of the amplifier.

19. The apparatus of claim 1, wherein the transistor is a field-effect transistor.

20. The protection circuit of claim 8, wherein the first transistor is a field-effect transistor.

* * * * *